(12) United States Patent
Louh

(10) Patent No.: US 8,217,506 B2
(45) Date of Patent: Jul. 10, 2012

(54) SEMICONDUCTOR PACKAGING STRUCTURE HAVING CONDUCTIVE GEL TO PACKAGE SEMICONDUCTOR DEVICE

(75) Inventor: Sei-Ping Louh, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 64 days.

(21) Appl. No.: 12/685,882

(22) Filed: Jan. 12, 2010

(65) Prior Publication Data

US 2010/0327423 A1    Dec. 30, 2010

(30) Foreign Application Priority Data

Jun. 29, 2009   (CN) .......................... 2009 1 0303832

(51) Int. Cl.
*H01L 23/473* (2006.01)

(52) U.S. Cl. ........ 257/690; 257/691; 257/692; 257/720; 257/706; 257/E23.098

(58) Field of Classification Search .......... 257/690–692, 257/706, 720, E23.01, E23.098
See application file for complete search history.

(56) References Cited

U.S. PATENT DOCUMENTS

| 2008/0023721 A1* | 1/2008 | Lee et al. ........................ 257/99 |
| 2010/0103678 A1* | 4/2010 | Van De Ven et al. ......... 362/294 |

* cited by examiner

*Primary Examiner* — Cuong Q Nguyen
*Assistant Examiner* — Tran Tran
(74) *Attorney, Agent, or Firm* — Altis Law Group, Inc.

(57) ABSTRACT

The present application provides a method and semiconductor packaging structure comprising a conductive substrate having a first surface, a first lateral surface and a second lateral surface adjacent to the first surface. A first electrode line with two ends are provided on the first surface and the first lateral surface, and a second electrode line with two ends are provided on the first surface and a second lateral surface respectively. A semiconductor device is provided on the first surface of the conductive substrate which electrically connected to the first electrode line and the second electrode line, a protective plate with through holes covers the first surface, and a sheathing overlays the semiconductor device.

9 Claims, 7 Drawing Sheets

SEMICONDUCTOR PACKAGING STRUCTURE HAVING CONDUCTIVE GEL TO PACKAGE SEMICONDUCTOR DEVICE

CROSS-REFERENCE TO RELATED APPLICATION

This application is related to, and claims the benefit of, a foreign priority application filed in China as Application No. 200910303832.X on Jun. 29, 2009. The related application is incorporated herein by reference.

BACKGROUND

1. Technical Field

The present application is related to a packaging structure for a semiconductor device, and a method for manufacturing the packaging structure.

2. Description of Related Art

Solar cells are usually packed and realized as semiconductor devices. During operation of such semiconductor devices, temperature of semiconductor devices will be raised due to heat created by solar cells. Therefore, operation efficiency of the semiconductor devices for solar cells will decrease. Holders help dissipate heat created by the semiconductor devices, but dissipation through holders is not very efficient. A heat dissipation plate is usually provided on one side of the circuit board, opposite to another side that semiconductor devices are provided on, to dissipate heat of the semiconductor devices. However, such package easily forms heat spots, thus heat dissipation is neither prompt nor uniform. Therefore, a packaging structure for semiconductor devices with high heat dissipation efficiency is desirable.

DETAILED DESCRIPTION

Figure 1:
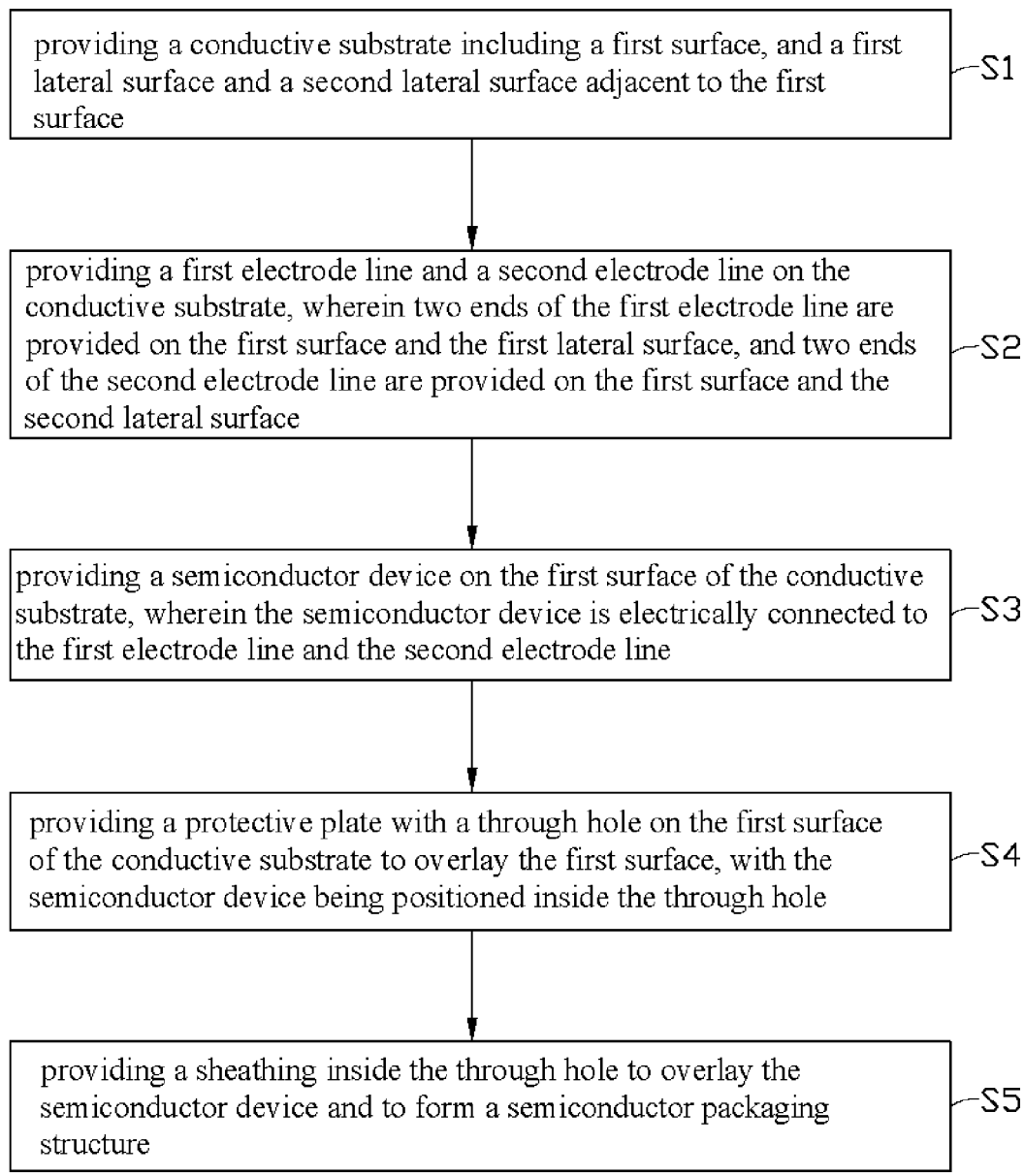
FIG. 1 is a flowchart of one embodiment of a semiconductor packaging method of the present application.

FIG. 1 shows one embodiment of a flowchart for the semiconductor packaging method of the present application. In step S1, a conductive substrate including a first surface, and a first lateral surface and a second lateral surface adjacent to the first surface, is provided. In step 52, a first electrode line and a second electrode are provided on the conductive substrate, wherein two ends of the first electrode line are provided on the first surface and the first lateral surface of the conductive substrate, and two ends of the second electrode line are provided on the first surface and the second lateral surface of the conductive substrate. In step S3, a semiconductor device is provided on the first surface of the conductive substrate, and is electrically connected to the first electrode line and the second electrode line. In step S4, a protective plate with a through hole is provided on the first surface of the conductive substrate to overlay the first surface, with the semiconductor device being positioned inside the through hole. In step S5, a sheathing is provided inside the through hole to overlay the semiconductor device and to form a semiconductor packaging structure.

Figure 2:
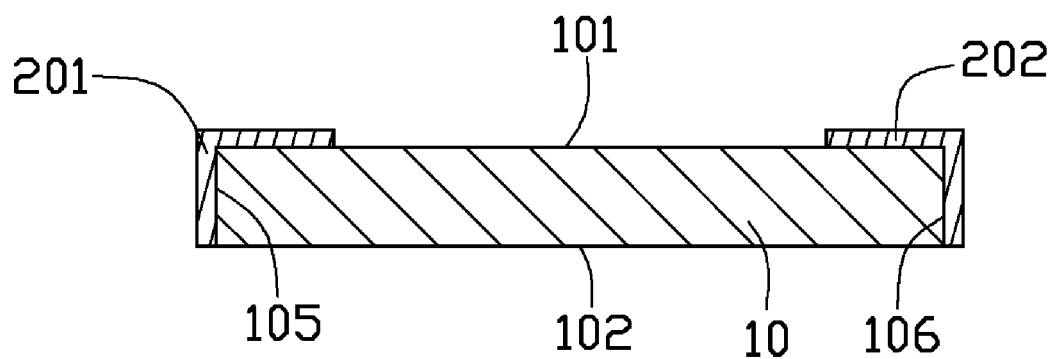
FIG. 2 is a schematic drawing showing one embodiment of a conductive substrate with a first electrode line and a second electrode line provided on the conductive substrate of a packaging structure as disclosed.

FIG. 2 shows one embodiment of a conductive substrate 10 of a semiconductor packaging structure as disclosed, which comprises a first surface 101, a second surface 102 opposite to the first surface 101, a first lateral surface 105 and a second lateral surface 106 positioned between the first surface 101 and the second surface 102. The lateral surface 105 is adjacent to the first surface 101 and the second surface 102. In one embodiment of the present application, the material of the conductive substrate 10 may be aluminum. In other embodiments, the conductive substrate 10 can alternatively be copper, iron, or ceramics, for example.

A first electrode line 201 and a second electrode line 202 are provided on the conductive substrate 10, in which two ends of the first electrode line 201 are provided on the first surface 101 and the first lateral surface 105, and two ends of the second electrode line are provided on the first surface 101 and the second lateral surface 106, respectively. In one embodiment of the present application, the first electrode line 201 and the second electrode line 202 are provided through a silver jet application. The first electrode line 201 and the second electrode line 202 can be also provided through a gold silk-screen printing.

Figure 3:
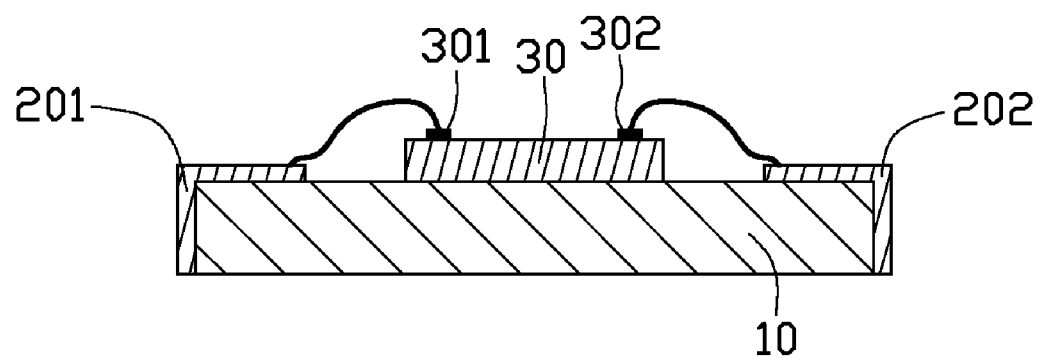
FIG. 3 is a schematic drawing showing one embodiment of a semiconductor device provided on the conductive substrate of FIG. 2, which is electrically connected to the first electrode line and the second electrode line.

FIG. 3 shows one embodiment of a semiconductor device 30, provided on the first surface 101 of the conductive substrate 10 of FIG. 2, and electrically connected to the first electrode line 201 and the second electrode line 202. The semiconductor device 30 includes a third electrode 301 and a fourth electrode 302 positioned on the same side. The third electrode 301 and the fourth electrode 302 are connected to the first electrode line 201 and the second electrode line 202 through gold lines. The semiconductor device 30 is provided on the first surface 101 through adhesive attaching. In the embodiment of the present application, the semiconductor device 30 is a solar cell, but it can alternatively be a light emitting diode. The third electrode 301 and the fourth electrode 302 can be also positioned on different sides.

Figure 4:
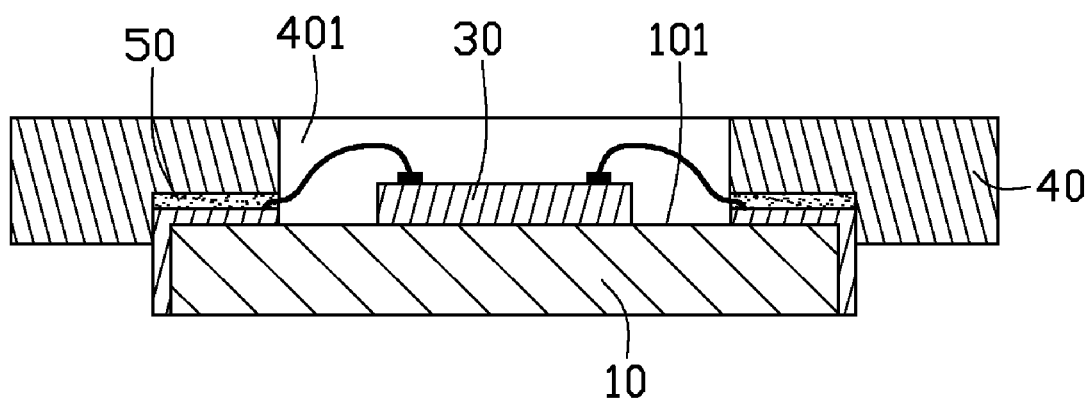
FIG. 4 is a schematic drawing showing one embodiment of a protective panel provided on the conductive substrate of FIG. 3, which comprises through holes.

FIG. 4 shows one embodiment of a protective plate 40 with a through hole 401, which is provided on the first surface 101 of the conductive substrate 10 of FIG. 2, to overlay the first surface 101. The semiconductor device 30 is positioned within the through hole 401. In one embodiment of the present application, an adhesive layer 50 is provided on the first surface 101, and the protective plate 40 is combined with the conductive substrate 10 through the adhesive layer 50.

Figure 5:
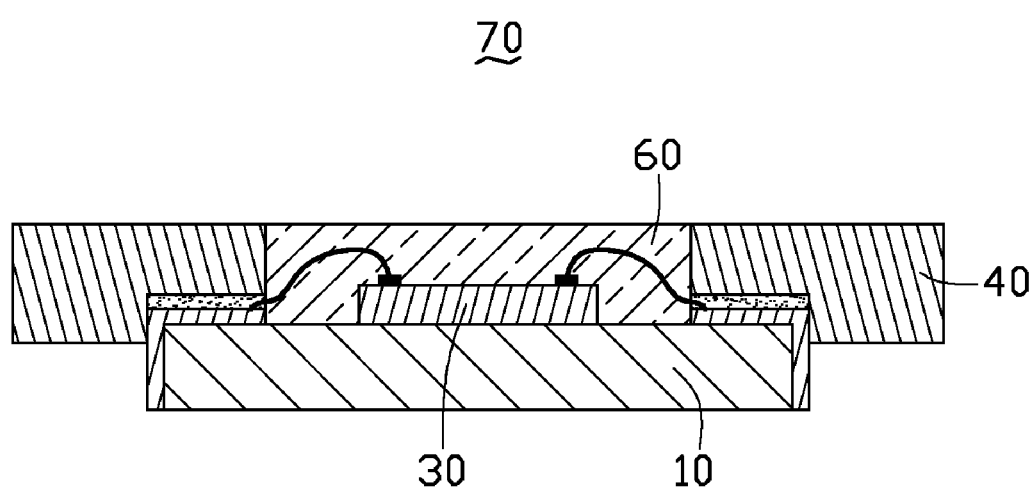
FIG. 5 is a schematic drawing showing one embodiment of a sheathing provided within the through holes of FIG. 4.

FIG. 5 shows one embodiment of a sheathing 60, provided within the through hole 401, to overlay the semiconductor device 30 for forming the semiconductor packaging structure 70. In one embodiment, the sheathing 60 may be formed by mold filling silicone gel into the through hole 401, and solidifying the silicone gel. The sheathing 60 can prevent air reacting with the semiconductor device 30, thereby increasing the efficiency of the semiconductor device 30. The material of the sheathing 60 can also be epoxy resin, or other pervious materials.

Figure 6:
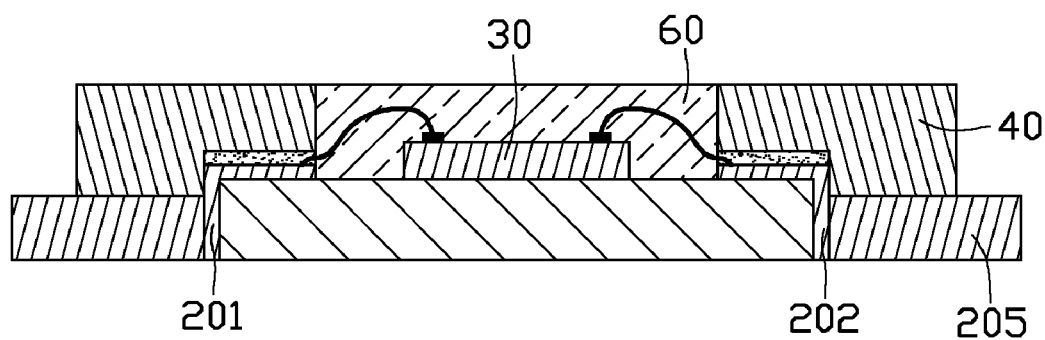
FIG. 6 is a schematic drawing showing one embodiment of conductive gel provided in the lateral of the conductive substrate of FIG. 5.

FIG. 6 shows one embodiment of conductive gel 205 applied to a portion of the first electrode line 201 and the second electrode line 202 for electrical conductance.

Figure 7:
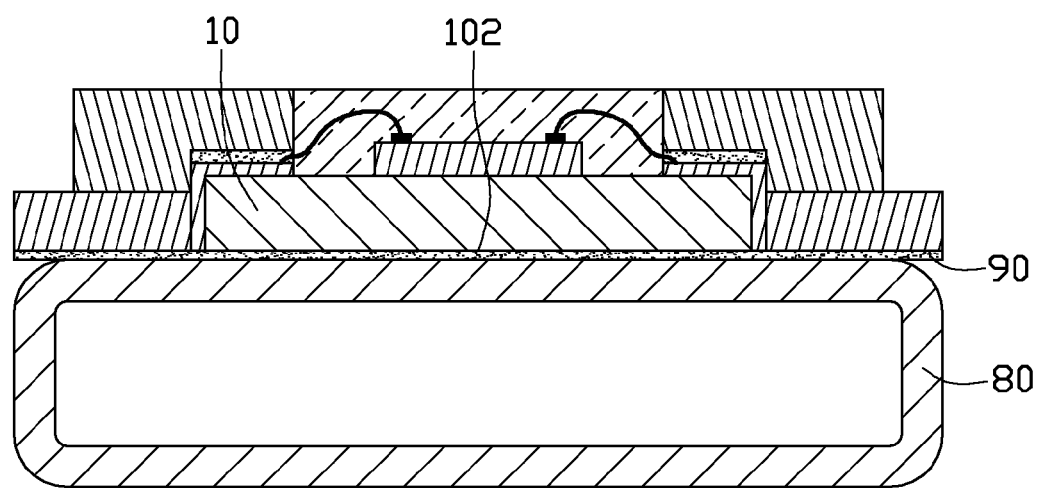
FIG. 7 is a schematic drawing showing one embodiment of a cool water tube provided under the conductive substrate of FIG. 6.

FIG. 7 shows one embodiment of a cold water tube 80 joined with the second surface 102 of the conductive substrate 10 to provide improved heat dissipation. In one embodiment of the present application, dielectric conductive gel 90 of polyetherimide is provided on a surface of the cold water tube 80 to join the second surface 102 of the conductive substrate 10 with the cold water tube 80. The dielectric conductive gel 90 can instead be polycarbonate or polystyrene.

The disclosed semiconductor structure 70 provides improved heat dissipation and prevents heat spots through by directly providing the semiconductor device 30 on the conductive substrate 10. The cool water tube 80 is provided to the semiconductor packaging structure 70 to enhance heat dissipation.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor packaging structure, comprising:
   a conductive substrate comprising a first surface, and a first lateral surface and a second lateral surface adjacent to the first surface;
   a first electrode line and a second electrode line provided on the conductive substrate, wherein two ends of the first electrode line are provided on the first surface and the first lateral surface, and two ends of the second electrode line are provided on the first surface and the second lateral surface;
   a semiconductor device provided on the first surface of the conductive substrate, and electrically connected to the first electrode line and the second electrode line;
   a protective plate with a through hole, wherein the ends of the first and second electrode lines on the first surface are covered by the protective plate, a portion of the end of the first electrode line on the first lateral surface and a portion of the end of the second electrode line on the second lateral surface are exposed out of the protective plate, and the semiconductor device is positioned inside the through hole;
   a sheathing provided in the through hole to overlay the semiconductor device; and
   a conductive gel provided to directly contact the portions of the ends of the first and second electrode lines where the first and second electrode lines are exposed out of the protective plate, wherein the conductive gel is electrically connected to the first and second electrode lines and cooperates with the protective plate to seal the first and second electrode lines.

2. The semiconductor package structure as claimed in claim 1, wherein the conductive substrate is made of metal or ceramics.

3. The semiconductor package structure as claimed in claim 1, wherein the semiconductor device comprises a first electrode and a second electrode electrically connected to the first electrode line and the second electrode line, respectively.

4. The semiconductor package structure as claimed in claim 1, wherein the sheathing is made of silicone or epoxy resin.

5. The semiconductor package structure as claimed in claim 1, further comprising a cold water tube joined with a second surface of the conductive substrate, wherein the second surface is opposite to the first surface.

6. The semiconductor package structure as claimed in claim 5, wherein a dielectric conductive gel is provided between the cold water tube and the second surface of the conductive substrate thereby joining the cold water tube with the second surface.

7. The semiconductor package structure as claimed in claim 5, wherein the cold water tube is arranged as a ring shape, and a portion of the cold water tube is joined with the second surface of the conductive substrate.

8. The semiconductor package structure as claimed in claim 1, wherein the conductive gel extends along directions perpendicular to the first and second lateral surfaces and exceeds edges of the protective plate.

9. The semiconductor package structure as claimed in claim 8, wherein the ends of the first electrode line directly contact the first surface and the first lateral surface, and the ends of the second electrode line directly contact the first surface and the second lateral surface.

* * * * *